(12) United States Patent
Lehmann et al.

(10) Patent No.: US 8,178,966 B2
(45) Date of Patent: May 15, 2012

(54) INTEGRATED COOLANT CIRCUIT ARRANGEMENT, OPERATING METHOD AND PRODUCTION METHOD

(75) Inventors: Volker Lehmann, Munich (DE);
Reinhard Stengl, Stadtbergen (DE);
Herbert Schäfer, Hoehenkirchen-Siegertsbrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/940,713

(22) Filed: Nov. 5, 2010

(65) Prior Publication Data

US 2011/0042046 A1 Feb. 24, 2011

Related U.S. Application Data

(60) Division of application No. 11/324,789, filed on Jan. 3, 2006, which is a continuation of application No. PCT/EP2004/051116, filed on Jun. 15, 2004.

(30) Foreign Application Priority Data

Jul. 8, 2003 (DE) .................................. 103 30 731

(51) Int. Cl.
*H01L 21/36* (2006.01)

(52) U.S. Cl. ................ 257/715; 257/716; 257/E33.075; 165/104.26

(58) Field of Classification Search .................... 257/715
See application file for complete search history.

(56) References Cited

U.S. PATENT DOCUMENTS

| | | | |
|---|---|---|---|
| 6,365,260 B1 * | 4/2002 | Stecher et al. | 428/138 |
| 6,437,981 B1 * | 8/2002 | Newton et al. | 361/700 |
| 6,481,491 B2 * | 11/2002 | Kabrell et al. | 165/80.3 |
| 2002/0170705 A1 * | 11/2002 | Cho et al. | 165/104.26 |
| 2003/0151896 A1 * | 8/2003 | Zeighami et al. | 361/700 |
| 2005/0139996 A1 * | 6/2005 | Myers et al. | 257/712 |
| 2011/0042046 A1 * | 2/2011 | Lehmann et al. | 165/104.26 |

* cited by examiner

*Primary Examiner* — Wael Fahmy
*Assistant Examiner* — Abul Kalam

(57) ABSTRACT

An integrated circuit arrangement and method of fabricating the integrated circuit arrangement is provided. At least one integrated electronic component is arranged at a main area of a substrate. The component is arranged in the substrate or is isolated from the substrate by an electrically insulating region. Main channels are formed in the substrate and arranged along the main area. Each main channel is completely surrounded by the substrate transversely with respect to a longitudinal axis. Transverse channels are arranged transversely with respect to the main channels. Each transverse channel opens into at least one main channel. More than about ten transverse channels open into a main channel.

6 Claims, 4 Drawing Sheets

INTEGRATED COOLANT CIRCUIT ARRANGEMENT, OPERATING METHOD AND PRODUCTION METHOD

PRIORITY CLAIM

This application is a divisional application of U.S. patent application Ser. No. 11/324,789, filed Jan. 3, 2006, which is a continuation of international application PCT/EP2004/051116, filed on Jun. 15, 2004, which claims priority to German Patent Application DE 103 30 731.1, filed on Jul. 8, 2003, all of which are incorporated by reference in their entirety.

TECHNICAL FIELD

The present invention relates to an integrated circuit arrangement. More particularly, the present invention relates to an integrated circuit arrangement having cooling channels disposed in the underlying substrate.

BACKGROUND

The use of integrated circuits in electronic devices has increased dramatically in recent years. Integrated circuit arrangements contain a substrate, the surface of which forms a main area, and multiple integrated electronic components arranged at the main area. The components are arranged in the substrate and are isolated from the substrate by a solid electrically insulating region when an SOI technique (silicon on insulator) is used. Channels are formed in the substrate and are arranged along the main area to cool the arrangement. Such a coolant circuit arrangement is disclosed in U.S. Pat. No. 4,450,472, for example. The circuit arrangement explained therein contains cooling trenches oriented parallel to one another which have been etched into a chip and in which a coolant is transported. The trenches are covered with a covering plate such that channels arise. Water is used as coolant. The water is pumped through the cooling channels with the aid of an external pump.

With the increase of usage of the integrated circuit arrangements, the demand for miniaturization of these arrangements has also correspondingly increased. The generation of heat in integrated circuit arrangements and unsatisfactory heat dissipation may restrict the performance of processors and of radiofrequency assemblies and decrease reliability as the electrical power density and integration density increase. Cooling is more effective the closer the cooling medium can be brought to the heat source, since, as the integration density increases, the thermal resistance of the substrate increases proportionally to the number of heat sources distributed in the component layer. However, as the integrated circuit arrangements become miniaturized to a greater extent, cooling of the integrated circuit arrangements by means such as that disclosed in U.S. Pat. No. 4,450,472 has become more problematic. In particular, the cross section of the channels is relatively large and the cooling structure independent of the medium used to cool the arrangement. Also, the addition of a further element, a covering plate, increases the fabrication time and expense. Moreover, often a cooling mechanism is used to force flow of the cooling medium. This cooling mechanism can be a pump having moving parts in which wear occurs over time, or a pump that is operated using an electric current, thereby increasing the power consumption of the overall circuit.

BRIEF DESCRIPTION OF THE DRAWINGS

The present invention is illustrated by way of example and not limited to the accompanying figures in which like references indicate similar elements. Exemplary embodiments will be explained in the following text with reference to the attached drawings, in which.

Skilled artisans appreciate that elements in the figures are illustrated for simplicity and clarity and have not necessarily been drawn to scale.

DETAILED DESCRIPTION

An integrated circuit arrangement and fabrication method is provided in which cooling channels are disposed in the substrate and electronic components are arranged in and/or on the surface of the substrate. The cooling channels include main channels and transverse channels that extend traverse to the main channels. The main channels are completely surrounded by the substrate transversely with respect to their longitudinal axis while simultaneously maintain the mechanical stability of the substrate. This reduces the cross section of the main channels and permits the use of capillary forces to transport the cooling medium. As the heat arises directly at the components, the heat is thus dissipated over a large area.

Each transverse channel opens into at least one main channel. Multiple transverse channels, such as more than ten or more than a hundred, can open into a single main channel. The cross-sectional areas of these channels can be chosen independently of one another, with the result that the cross sections can be optimally coordinated with the cooling medium (or coolant) as well as the type of cooling used, e.g. cooling with or without a phase transition between liquid phase and gaseous phase. Various numerical quantities, shapes, substrates, etchants, et al. provided throughout the specification, are exemplary only and may vary as desired.

Figure 1:
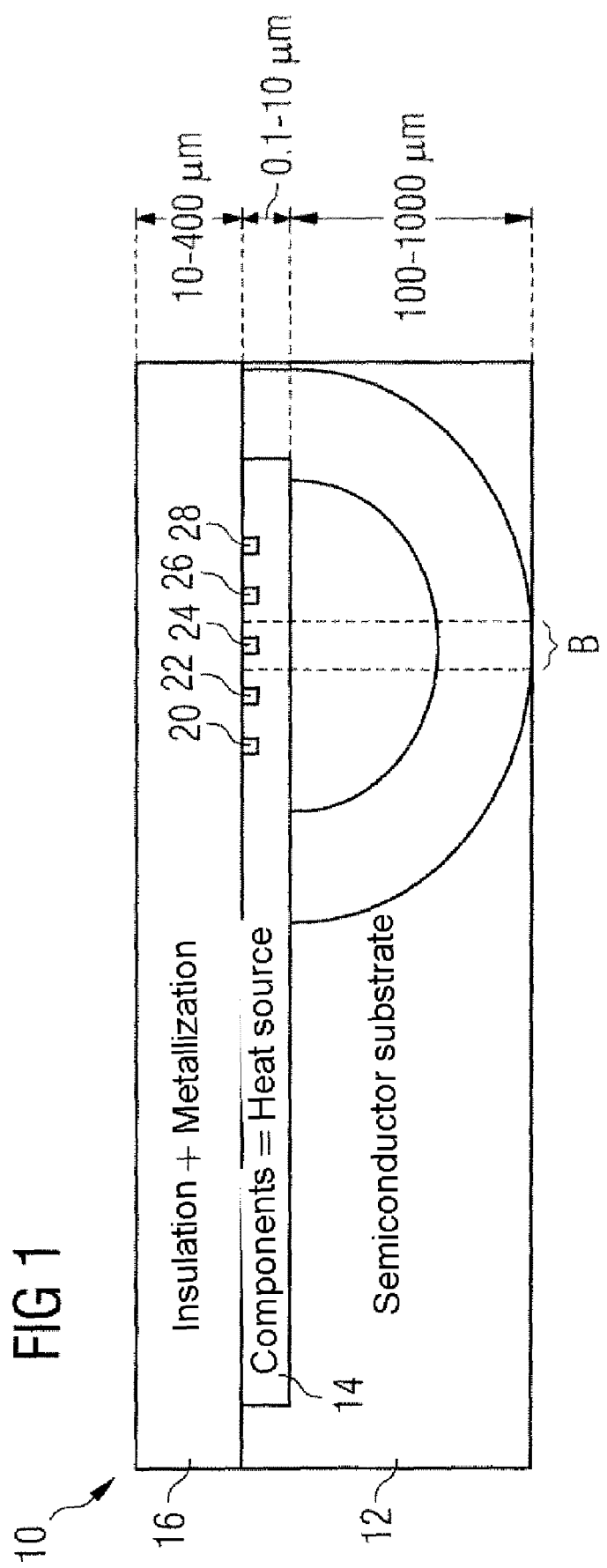
FIG. 1 shows a basic illustration of heat dissipation in an integrated circuit arrangement.

FIG. 1 shows a basic illustration of the heat dissipation in an integrated circuit arrangement 10 containing a semiconductor substrate 12, an active region 14 in the substrate 12, and a plurality of metallization and insulation layers 16. The substrate may contain silicon and may be, for example, an n-doped silicon substrate. The semiconductor substrate 12 has a thickness of between about 100 and 1000 μm. The active region 14 contains multiple active electronic components, e.g. transistors, of which five components 20 to 28 are illustrated in FIG. 1. The active region 14 has a thickness of about 0.1 to 10 μm. The metallization and insulation layers 16 contain four metallization planes, for example, between each of which a layer of insulating material is situated. The metallization and insulating layers 16 have a total thickness of between about 10 and 400 μm. The metallization and insulating layers 16 may contain silicon dioxide, among other components.

The majority of the heat dissipation is effected via the substrate 12 since silicon conducts the heat approximately a hundred times better than silicon dioxide. As shown to a course approximation, while the heat of the component 28 lying at the edge can be dissipated spherically toward the outside, the heat of a component lying further in the middle is dissipated downward via a correspondingly smaller region B. Maximizing the cooling surface that is available to each component permits maximization of heat dissipation, in one example, owing to the good thermal conductivity of the substrate.

Figure 2:
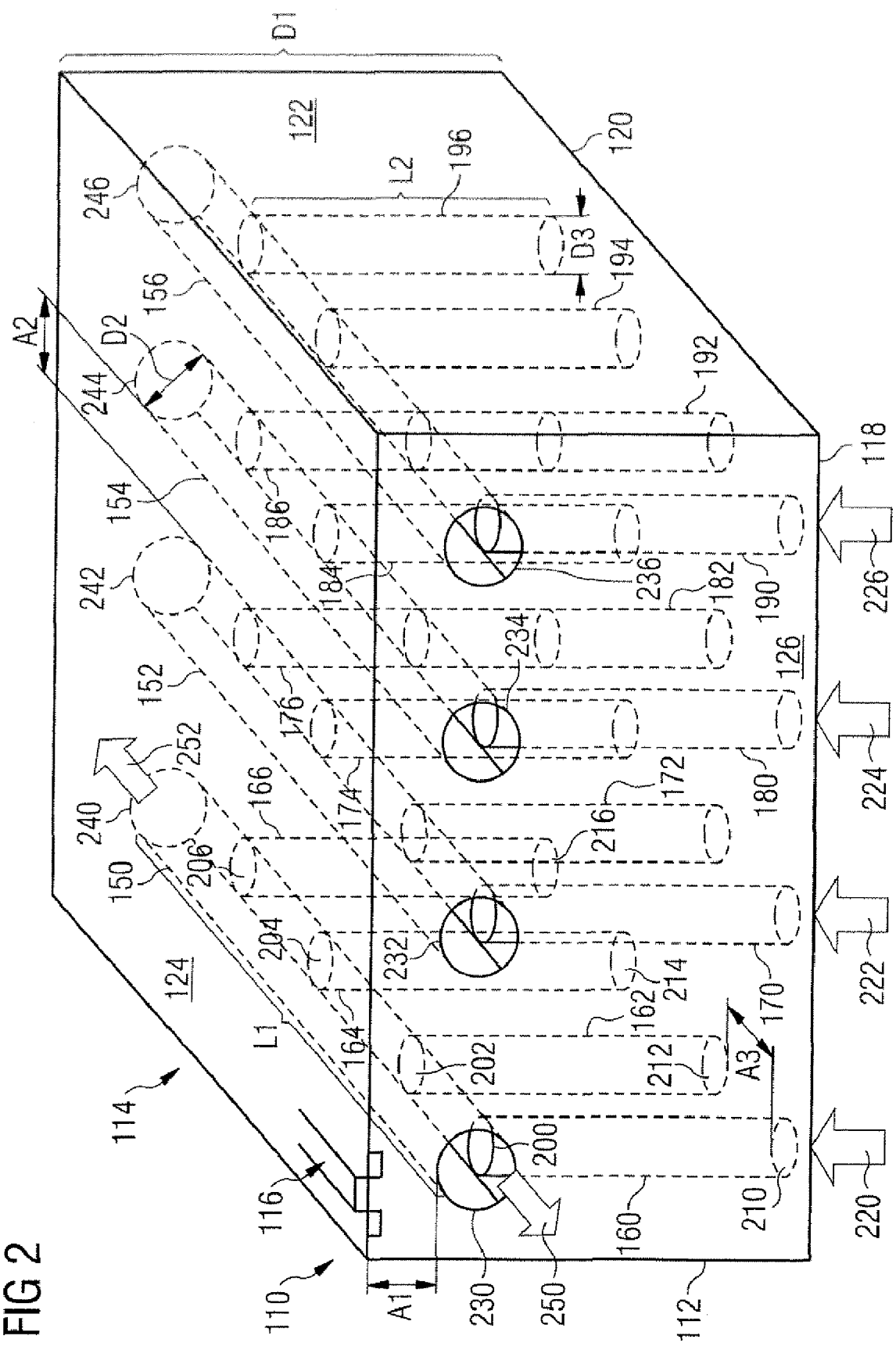
FIG. 2 shows an integrated circuit arrangement with thick main channels and thin transverse channels.

FIG. 2 shows an integrated circuit arrangement 110 in a silicon substrate 112. The silicon substrate 112 is parallelepipedal after the singulation of individual chips and may be monocrystalline. One or more integrated components are situated in a top area 114 of the silicon substrate 112. These integrated components can include a MOS (metal oxide semiconductor) transistor 116 among others. The top area 114 is bounded by four side areas 118 to 124. The side areas 118 to 124 end at a bottom area 126 of the silicon substrate 112 arranged below the top area 114. A thickness D1 of the silicon substrate 112 is about 725 µm.

Four main channels 150 to 156 are illustrated in FIG. 2. Upper edges of main channels arranged parallel to one another lie at a distance A1 of about 10 µm. The main channels 150 to 156 have circular cross sections with a diameter D2 of about 20 µm. A length L1 of the main channels 150 to 156 is in each case 1 cm. The main channels 150 to 156 are aligned in a plane lying parallel to the top area 114. The distances between adjacent main channels are identical. Thus, a distance A2 between the edges of mutually adjacent main channels 152, 154 is about 10 µm.

Multiple transverse channels extend from the bottom area 126 toward the top area 114. The transverse channels are aligned in rows beneath a respective main channel. FIG. 2 illustrates four transverse channels 160 to 166 below the main channel 150, four transverse channels 170 to 176 below the main channel 152, four transverse channels 180 to 186 below the main channel 154 and four transverse channels 190 to 196 beneath the main channel 156. The transverse channels lying beneath a main channel 150 to 156 open into the associated main channel. The transverse channels 160 to 196 thus have a length L2 of about 695 µm up to an end of the openings 200 to 206 that is remote from the top area. A diameter D3 of the transverse channels 160 to 166 is about 10 µm. A distance A3 between adjacent transverse channels 160, 162 of a row of transverse channels is likewise about 10 µm.

The transverse channels have a diameter of about 1 to 10 µm and a distance A3 of about 1 to 20 µm and also a length of about 100 to 1000 µm. The transverse channels 160 to 196 carry, in a cooling circuit with heat exchanger and pump, the cooling medium to a few micrometers beneath the electronic components 116, see entry openings 210 to 216 and also arrows 220 to 226. After the cooling medium exits from the transverse channels 160 to 196, the cooling medium is conducted along in the main channels 150 to 156 beneath the top area 114 to exit openings 230 to 246 in the side area 118 and in the side area 122. The heated cooling medium which exits there is then fed again to an external cooling circuit with heat exchanger and pump, see arrows 250 and 252. Accordingly, in one embodiment, the cooling medium remains in the liquid phase in the entire cooling circuit.

The transverse channels may have a length of greater than about 100 µm or greater than about 200 µm. In one embodiment, the transverse channels have a length that is more than about ¾ of the thickness of the substrate. This permits the cooling medium to be transported close to the active components in the transverse channels or, as an alternative, to be transported from a location close to the active components, that is to say from a hot location having temperatures of e.g. above about 100° C., through the transverse channels toward the outside. The transverse channels are shorter than the main channels and have a length that is less than about 1/10 or less than about 1/20 of the length of a main channel. As the wafer diameter increases, the substrate thickness also becomes larger. Thus, transverse channels having a length of more than about 650 µm may be present for 300 mm wafers.

Experimental data verify that, given a pore length of 500 µm and a diameter of 8 µm and also given a distance A3 of 12 µm, with a pressure of 1 bar, it is possible to pump 10 ml of water per second and $cm^2$ chip area. Given a chip power of about 1000 watts per $cm^2$, this would lead to a heating of cooling water of approximately 25° C. This is approximately equal to the additional heating that would be obtained in the case of a 350 µm thick silicon chip for the same power on account of the thermal resistance of the substrate 112. An increase in performance by virtue of the direct cooling by means of substrate pores is thus expected, as considered from the substrate 112, at very high power densities, since silicon is a very good thermal conductor. Direct cooling by means of the main channels 150 to 156 and the transverse channels 160 to 196 is also worthwhile even at very much lower power densities, since one of the main problems in the packaging is the heat transfer from the silicon to the underlying metal or ceramic substrate. This heat transfer is subordinate by virtue of the increased surface area of the main channels 150 to 156 and of the transverse channels 160 to 196 in comparison with the surface area of the bottom area 126 and the associated good heat transfer to the cooling medium. By way of example, the surface area of the main channels 150 to 156 and of the transverse channels 160 to 196 is more than a hundred times as large as the top area 114 or the bottom area 126 of the substrate 112.

In another embodiment in which an external pump is used, the cooling medium is pumped into the main channels 150 to 156 and flows out from the transverse channels 160 to 196.

The longitudinal axes of the main channels may be oriented parallel to one another. Similarly, the longitudinal axes of the transverse channels may be likewise oriented parallel to one another. Transverse and main channels arranged in this way can be produced in a simple manner by means of the production methods suitable for integrated circuit arrangements, for example, using etching methods. The longitudinal axes of the transverse channels may lie normal to the main area with the active components.

Mutually opposite sides of one main channel or of all the main channels may have a distance of less than about 40 µm or less than about 10 µm. In one example, the distance along the entire main channel is less than the aforementioned dimensions. On account of the small dimensions of the main channel, the main channel can transport a cooling medium by way of capillary forces, over distances of a number of millimeters or centimeters.

Similarly, mutually opposite sides of one transverse channel or of all the transverse channels may have a distance of less than about 40 µm or less than about 10 µm, along some or all of the entire transverse channel. This allows the transverse channels to transport the cooling medium using the capillary forces without the addition of a separate pump.

In another example, the minimum distance between the edges of mutually adjacent main and/or transverse channels may be less than about 40 µm, less than about 20 µm, or less than about 10 µm. The choice of these distances ensures that the substrate has transverse channels and/or main channels running through it in close-meshed fashion and, consequently, there is a large area present for transferring heat between the substrate and the cooling medium in the channels. However, the distances chosen are not so small that the stability of the substrate or the stability of the walls of the transverse channels and/or of the main channels is impaired excessively. By way of example only, the minimum distances may be greater than about 1 µm or greater than about 3 µm.

The edges of the main channels may lie less than about 50 µm or less than about 10 µm away from the main area. If the circuit arrangement does not contain any deep trenches, then the main channels may be brought to a distance of less than about 5 µm or even less than about 2 µm from the main area. This permits the use of substrates which have a thermal conductivity lower than that of a basic material made of silicon, e.g. by at least one order of magnitude, even if powers of up to about several hundred watts are generated by the integrated circuit arrangement. Examples of such substrates are ceramics, glass substrates or else polymer substrates. However, a small distance between the active components and the main channels affords advantages in terms of heat engineering, such as counteracting temperature spikes, when silicon is used.

Figure 3:
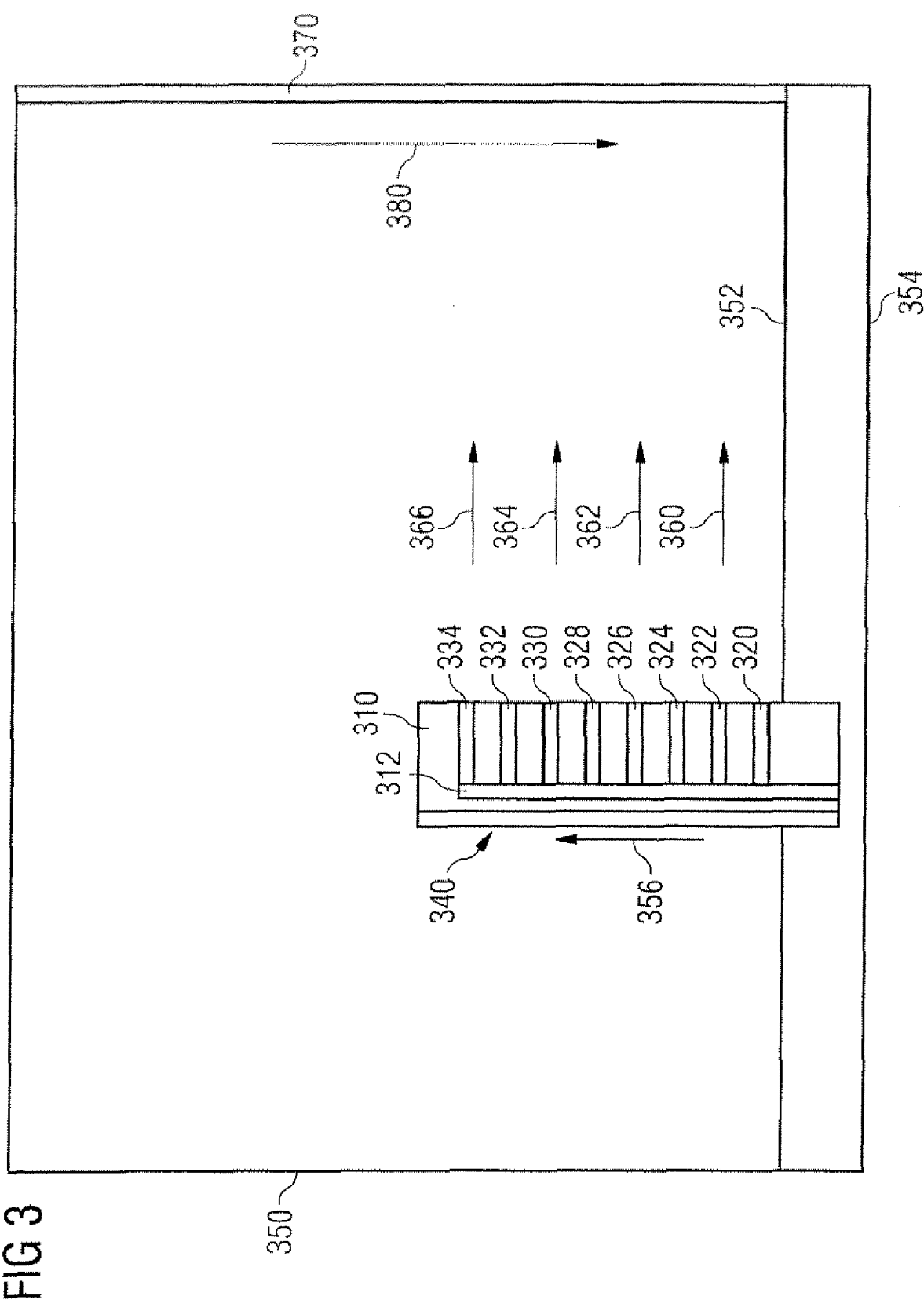
FIG. 3 shows an integrated circuit arrangement in a pump-free cooling system.

FIG. 3 shows an integrated circuit arrangement 310 containing main channels 312 and transverse channels 320 to 334. The dimensions of and the distance between the main channels 312 and the transverse channels 320 to 324 correspond to the dimensions above with reference to FIG. 2. The main channels 312 may have the same cross section as the transverse channels 320 to 334.

The integrated components are arranged at a top area 340. The integrated components can be one or more power semiconductor components. A power semiconductor component switches currents of greater than about 1 ampere or greater than about 10 amperes. The integrated circuit arrangement 310, which is sealed or protected against water, is situated in an air- and watertight housing 350, the volume of which exceeds by a multiple the volume of the substrate of the integrated circuit arrangement 310. By way of example, the housing 350 may be 7 cm×7 cm×7 cm, while the circuit arrangement 310 is 2 cm×2 cm×1 mm. The position illustrated in FIG. 3 is the working position in which a cooling liquid 352, for example water, collects at a bottom 354 of the housing 350 due to gravity. The water flows upward counter to the force of gravity due to capillary forces in the main channels 321, see arrow 356. Due to the heat prevailing at the top area 340, the transverse channels 320 to 334 transfer water vapor toward the outside, see arrows 360 to 366. In particular, the cooling liquid evaporates upon exiting from the transverse channels 320 to 334. The water vapor condenses on a cooled side area 370 of the housing 350. The condensed water runs to the bottom 354, see arrow 380. A large evaporating area is present due to the multiple transverse channels 320 to 334.

In another embodiment, the dimensions of FIG. 2 are maintained, but the integrated circuit arrangement 310 is rotated toward the right through 90° about an axis pointing out of the paper plane, i.e. parallel to the bottom 354. In this embodiment, entry openings of the transverse channels 320 to 334 lie in proximity to the bottom area 354 and the liquid water 352 flows first through the transverse channels 320 to 334 due to capillary action and then passes toward the outside as water vapor through the main channels 312. In particular, the cooling liquid evaporates upon exiting from the main channels 312.

Thus, the main channels 312 and the transverse channels 320 to 324 act as a capillary system of a heat pipe which transports heat away without using an additional external pump. The transport of the coolant is effected by means of the capillary forces in the main channels 312 and in the transverse channels 320 to 324. The cooling medium evaporates and the vapor leaves the substrate via the transverse channels 320 to 324 at the rear side or via the side openings of the main channels 312. The vapor then condenses on one or more side areas 370 or else on the top area 350.

Accordingly, the substrate may be surrounded by a housing in which a liquid cooling medium is situated. The liquid cooling medium may be partly in the gaseous state during operation of the integrated circuit arrangement. The cross section of the channels used to cool the integrated circuit arrangement may permit gaseous cooling medium to exit from the substrate. For example, if the main channels have capillary action, the transverse channels may have the same cross-sectional area as the main channels or a larger or smaller cross-sectional area than the main channels. If the transverse channels have capillary action, the main channels may be provided with a larger cross section than the transverse channels. As a result, the cooling medium entering into a main channel from a multiplicity of transverse channels can readily escape, e.g. in gaseous form, from the substrate in the main channel. In this case, for example, the main channel may have a cross section which is at least about ten times the cross section of a transverse channel. Such an arrangement permits the housing to avoid the use of a pump for transporting the coolant and also any orifices for the entry or exit of a coolant which comes from a pump or is transported to a pump.

In addition, the housing may contain a condensing device, which condenses gaseous cooling medium, in a cooled condensing area. Through the combination of capillary action and of a phase transition of the coolant, a heat pipe principle is utilized, achieving a thermal conductivity which exceeds the thermal conductivity of copper by a number of orders of magnitude.

If a pump system is used for transporting the coolant, osmotic pumps or electrokinetic pumps may be used. The cooling circuit contains e.g. only liquid coolant even during operation of the circuit arrangement. The liquid cooling medium may be pumped into the transverse channels and evaporate upon reaching the main channels. Using a condenser, the vaporous cooling medium may be re-liquefied and conducted to the pump. Alternatively, the coolant may be pumped into the main channels, where it evaporates at the transverse channels and through the transverse channels.

Figure 4A:
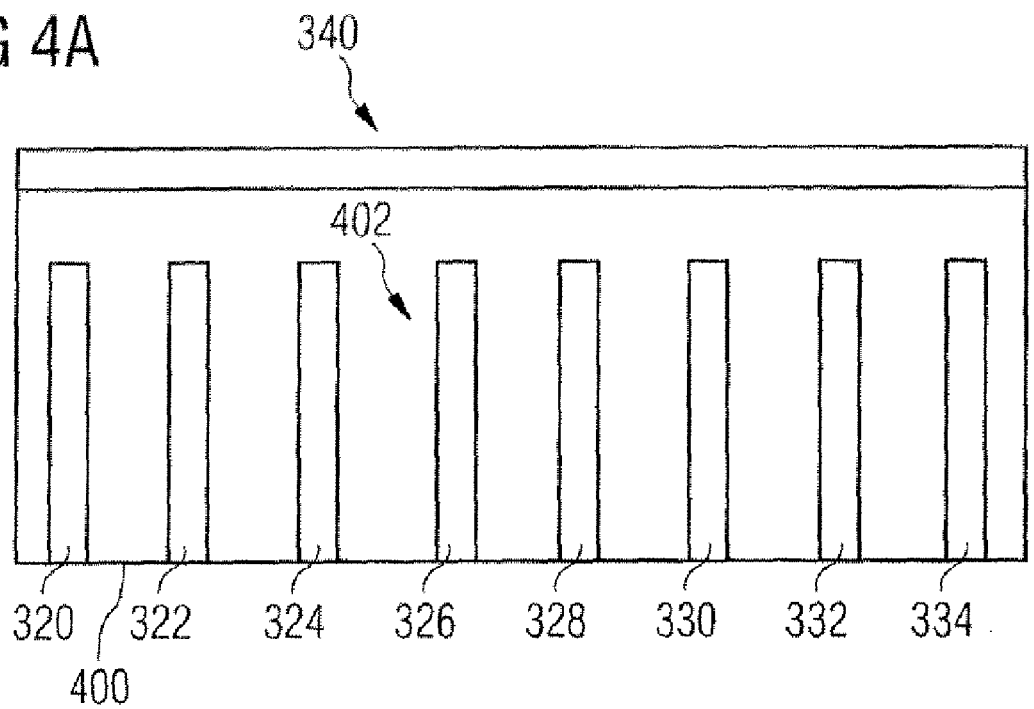
FIGS. 4A and 4B show production stages during the production of transverse channels and main channels.
Figure 4B:
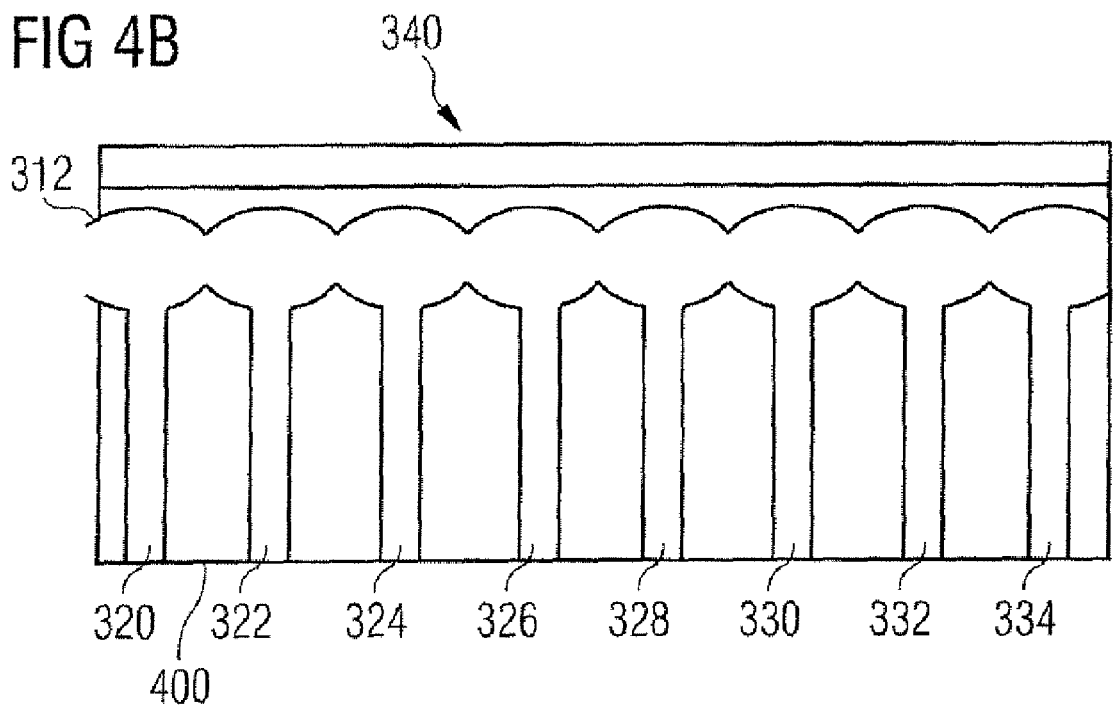

Turning to fabrication of the integrated circuit arrangement, FIGS. 4A and 4B illustrate fabrication of the transverse channels 320 to 334 and the main channel 312. An electrolytic etching of silicon in hydrofluoric acid HF is used for fabrication. N-doped silicon is used to produce macropores. In this case, the distance between the channels is defined by way of the doping concentration. If a p-doped substrate is used, then a p-doped layer is produced for the component layer by epitaxy or ion implantation on or in the n-type substrate. For an SOI substrate (silicon on insulator), the substrate doping for the components is independent of the substrate with the channels.

The substrate may contain silicon, for which a number of processing methods suitable for producing the main channels and the transverse channels are known. Thus, an n-doped silicon substrate may be suitable for electrochemical production of the transverse channels and of the main channels. In this connection, reference is made to the book "Electrochemistry of Silicon" by co-inventor V. Lehmann, which was published by VCH Wiley, 2002, herein incorporated by reference. The transverse channels may also be produced using the Bosch method, in accordance with DE 19 706 682 A1 or in accordance with DE 42 41045 C1, both of which are herein incorporated by reference. To produce the main channels, an etching method in accordance with WO 99/49506, herein incorporated by reference, may be used after etching the transverse channels.

The integrated electronic components may be produced after the introduction of the main channels and of the transverse channels in or at the main area. This may not impair the sensitive active region of the integrated circuit arrangement by the production steps for producing the main channels and the transverse channels. The orifices of the main channels and of the transverse channels may be closed off prior to the production of the integrated electronic components. In this case, the main channels and the transverse channels may not be plugged by processes for producing the integrated components. In this case, a sacrificial layer may be sputtered over the orifices of the main channels and of the transverse channels and selectively etched after the production of the integrated components.

The transverse channels are fabricated and the main channels are then subsequently produced by expanding the transverse channels, for example in an electrochemical removal process or in an etching process such as those referred to above. This avoids alignment problems during the production of the main channels and of the transverse channels. Moreover, it is possible to use a removal process or an etching process with a photolithographic step for producing both types of channel. Production of the transverse channels and the etching channels may be carried out in a single process chamber. The main channels and the transverse channels may then be expanded simultaneously after the formation of the openings to increase the cross-sectional area to an optimum cross-sectional area and without greatly altering the ratio of the cross sections of main channels to the cross sections of the transverse channels.

Hydrofluoric acid may be used in an electrochemical etching method to form the main channels and the transverse channels. If substrate is a silicon substrate with an n-type doping, the substrate may be connected to a more positive potential than the hydrofluoric acid during the etching. The diameter of the transverse channels can be defined by way of the n-type doping of the silicon substrate. The position of the transverse channels may be defined by the position of the incipiently etched regions. Field spikes arise in the incipiently etched regions during the electrochemical etching, which lead to a high local removal of material. Such methods are explained in more detail in the above referenced book "Electrochemistry of Silicon" by V. Lehmann.

Referring to FIG. 4A, the transverse channels 320 to 334 are etched electrochemically from a rear side 400 of the silicon substrate. Typical values for pore distance and diameter on 100 ohm×cm n-type substrates are 10 µm in distance and 5 µm in diameter. The doping of the substrate 402 is coordinated with the density of the transverse channels 320 to 334 in order to avoid etching the transverse channels 320 to 334 into the substrate 402 with different depths.

Etching pits are etched using a photolithographic process, for example, to enable the fashioning of field spikes for starting the electrochemical removal at defined locations. The pores are then also etched at the rear side 400 in somewhat narrower fashion (not illustrated), so that the pores can later be sealed with a sacrificial layer containing, e.g. polycrystalline silicon. This prevents impurities from getting into the transverse channels 320 to 324 and also into the main channels 312 during the subsequent processing of the components. At the end of the vertical pore etching, about 30 µm away from the components, the channels are then enlarged to 15 to 20 µm by increasing the electrolysis current. This resulting in the channels touching and, according to their arrangement, continuous horizontal channels with a connection to the outside arise, see FIG. 4B. Modulation of the channel diameters by means of the electrolytic current is explained for example in the book "Electrochemistry of Silicon", V. Lehmann. This reference also explains the coordination between pore density and doping, and the modulation of the channel width that is required for producing the main channels at the end of the transverse channels.

In another embodiment, the etching of the transverse channels 320 to 334 and of the main channels 312 is followed by carrying out an isotropic silicon etching to extend the transverse channels 320 to 334 and the main channels 312 and achieve higher flow rates. The isotropic silicon etching may use hydrofluoric acid HF and nitric acid $HNO_3$, for example.

As already mentioned, prior to the processing of the components, the pores of the transverse channels 320 to 334 and of the main channels 312 are closed off in a region near the surface by the deposition of a sacrificial layer. The sacrificial layer is removed at the end of the overall process by polishing or etching-back, so that entry openings and exit openings of the transverse channels 320 to 334 and of the main channels 312 are uncovered again.

Thus, an integrated circuit arrangement and fabrication method is provided. Electronic components are arranged in and/or on the surface of the substrate and main and transverse cooling channels are disposed below the components in the substrates. The circuit arrangement may be operated such that cooling liquid is transported by capillary forces in the transverse channels and evaporated coolant exits from the main channels, or such that the liquid coolant is transported in the main channels by capillary forces and coolant vapor exits from the transverse channels. Both types of operation work in accordance with the heat pipe principle and work without external pumps.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

We claim:

1. A method for cooling a circuit arrangement, comprising: providing:
   a substrate, one surface of which forms a main area, at least one integrated electronic component arranged at the main area, the at least one component arranged in the substrate or isolated from the substrate by an electrically insulating region;
   a housing surrounding and encapsulating the substrate, a liquid cooling mechanism situated entirely within the housing, wherein the substrate is located entirely within the housing;
   main channels formed in the substrate and arranged along the main area, each of the main channels completely surrounded by the substrate transversely with respect to a longitudinal axis; and
   transverse channels arranged transversely with respect to the main channels, each transverse channel opening into at least one main channel, and more than about ten transverse channels opening into one main channel;
   transporting a cooling liquid from a collecting trough located in the housing by capillary forces in the transverse channels as far as one or more of the main channels to which the transverse channels are connected such that coolant vapor exits from the main channels or transporting the cooling liquid from the collecting trough by capillary forces in the main channels as far as one or more of the transverse channels to which the main channels are connected such that coolant vapor exits from the transverse channels; and condensing the coolant vapor to form the cooling liquid, which is introduced into the collecting trough.

2. The method of claim 1, wherein the cooling liquid is transported from the collecting trough by capillary forces in the transverse channels as far as one or more of the main channels to which the transverse channels are connected such that coolant vapor exits from the main channels.

3. The method of claim 1, wherein the cooling liquid is transported from the collecting trough by capillary forces in the main channels as far as one or more of the transverse channels to which the main channels are connected such that coolant vapor exits from the transverse channels.

4. The method of claim 1, further comprising providing a pump system connected to at least one of the main channels or the transverse channels, the pump system transporting the cooling liquid using a pump arranged outside the substrate.

5. The method of claim 1, wherein the housing comprises at least one cooling wall configured to condense the liquid cooling system.

6. The method of claim 1, wherein the collecting trough comprises the bottom portion of the housing.

\* \* \* \* \*